(12) United States Patent
Horak et al.

(10) Patent No.: US 6,228,706 B1
(45) Date of Patent: May 8, 2001

(54) VERTICAL DRAM CELL WITH TFT OVER TRENCH CAPACITOR

(75) Inventors: David Vaclav Horak, Essex Junction; Rick Lawrence Mohler, Willison; Gorden Seth Starkey, Jr., Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/384,298

(22) Filed: Aug. 26, 1999

(51) Int. Cl.[7] .................................. H01L 21/8242
(52) U.S. Cl. .................. 438/244; 438/243; 438/270; 438/386; 257/301; 257/302; 257/71
(58) Field of Search .................... 438/244, 243, 438/246, 259, 268, 285, 386, 212, 216; 257/302, 301, 71, 66, 68, 304

(56) References Cited

U.S. PATENT DOCUMENTS

| | | | |
|---|---|---|---|
| 4,713,678 | * 12/1987 | Womack | 357/23.6 |
| 4,864,374 | * 9/1989 | Banarjee | 357/23.6 |
| 5,055,898 | 10/1991 | Beilstein, Jr. et al. | 357/23.6 |
| 5,065,273 | 11/1991 | Rajeevakumar | 361/313 |
| 5,102,817 | 4/1992 | Chatterjee et al. | 437/47 |
| 5,105,245 | 4/1992 | Riemenschneider et al. | 357/23.6 |
| 5,177,576 | * 1/1993 | Kimura | 257/11 |
| 5,181,089 | * 1/1993 | Matsuo et al. | 257/299 |
| 5,216,266 | * 6/1993 | Ozaki | 257/302 |
| 5,488,011 | 1/1996 | Figura et al. | 437/60 |
| 5,529,944 | 6/1996 | Rajeevakumar | 437/52 |
| 5,561,308 | * 10/1996 | Kamata | 257/301 |
| 5,614,431 | 3/1997 | DeBrosse | 437/52 |
| 5,692,281 | 12/1997 | Rajeevakumar | 29/25.42 |
| 5,744,386 | 4/1998 | Kenney | 439/245 |
| 5,770,484 | 6/1998 | Kleinhenz | 438/155 |

* cited by examiner

*Primary Examiner*—Matthew Smith
*Assistant Examiner*—Belur Keshavan
(74) *Attorney, Agent, or Firm*—Scully, Scott, Murphy & Presser; Eugene T. Shkurko, Esq.

(57) ABSTRACT

A memory cell which comprises a substrate having a top surface; a capacitor extending vertically into the substrate for storing a voltage representing a datum, said capacitor occupying a geometrically shaped horizontal area; a transistor formed above the capacitor and occupying a horizontal area substantially equal to the geometrically shaped horizontal area, and having a vertical device depth, for establishing an electrical connection with the capacitor, in response to a control signal, for reading from, and writing to, the capacitor, wherein the transistor includes a gate formed near the periphery of said horizontal device area and having a vertical depth approximately equal to the vertical device depth; an oxide layer on an inside surface of the gate; a conductive body formed inside the oxide layer, said conductive body having a top surface and a bottom surface and a vertical depth approximately equal to the vertical device depth; and diffusion regions in the body near the top and bottom surfaces and a method of manufacturing the same is provided.

10 Claims, 3 Drawing Sheets

VERTICAL DRAM CELL WITH TFT OVER TRENCH CAPACITOR

FIELD OF THE INVENTION

The present invention relates to the manufacture and design of a self-aligned transistor for use in vertical storage cells, especially transistors for use in dynamic random access memory (DRAM) cells and advanced memory devices containing the same. Specifically, the memory cell of the present invention uses a vertical thin film transistor (TFT) created in a self-aligned process over the trench storage node.

BACKGROUND OF THE INVENTION

Generally, a semiconductor memory device such as a dynamic random access memory (DRAM) chip comprises a plurality of memory cells which are used to store a large quantity of information. Each memory cell includes a capacitor for storing electric charge and a transistor for opening and closing charge and discharge passages of the capacitor. The number of bits on DRAM chips has been increasing by approximately 4× every three years; this increase has been achieved through improvements in photolithographic techniques used to fabricate chips and innovations in cell design.

Among the first of these innovations was the use of three dimensional cell structures that utilized area above the silicon surface (stacked capacitor) or below the silicon surface (trench capacitor) for the storage capacitor. Since their introduction with the 4 M generation, trench capacitor innovations have kept pace with lithographic improvements. This has been accomplished largely by making structural changes inside the storage trench.

However, 64 M DRAM contained little cell structure innovation, hence DRAM cell size has not decreased in the same historical rate from the preceding 16 M generation. This has led to a larger chip and lower productivity of the 64 M DRAM cell than was predicted. The same trend is extending out through 256 M. In order to achieve acceptable cell size, new structures must be developed which require only 4 lithographic squares compared to current 8 square cells.

SUMMARY OF THE INVENTION

The present invention provides a memory cell such as a DRAM which requires only 4 lithographic squares to fabricate thereby significantly reducing the size of the memory cell compared to past generations wherein 8 lithographic squares were required in fabricating the same.

The present invention further provides a memory cell wherein the transistor of the cell is a thin film transistor (TFT) which is self-aligned to the trench storage node.

One aspect of the present invention is directed to a method of fabricating a memory cell, e.g. DRAM, having a thin film transistor self-aligned with the trench storage node. Such a method provides a memory cell having reduced cell size, and more importantly, the new cell design of the present invention has a high productivity associated therewith. Specifically, the method of the present invention comprises the steps of:

(a) providing a substrate, said substrate having a dielectric stack formed on a surface thereof;

(b) forming a vertical trench in said dielectric stack and said substrate;

(c) forming a capacitor node in said vertical trench, said capacitor node occupying a horizontal capacitor area; and (d) forming a transistor above said capacitor node, said transistor occupying a horizontal device area substantially equal to that of the horizontal capacitor area.

Step (d) above includes forming each of the following: a gate near the periphery of the horizontal device area; an oxide layer on an inside surface of the gate; a conductive body inside the oxide layer, said conductive body having a top surface and a bottom surface; and diffusion regions in the conductive body near the top and bottom surfaces.

The method of the present invention further includes the steps of forming a bitline coupled to the conductive body of the cell and forming a wordline that is coupled to the gate.

Another aspect of the present invention relates to a memory cell that is produced using the above self-aligned processing steps. Specifically, the memory cell of the present invention comprises: a substrate having a top surface; a capacitor extending vertically into the substrate for storing a voltage representing a datum, said capacitor occupying a geometrically shaped horizontal area; a transistor formed above the capacitor and occupying a horizontal area substantially equal to the geometrically shaped horizontal area, and having a vertical device depth, for establishing an electrical connection with the capacitor, in response to a control signal, for reading from, and writing to, the capacitor, wherein the transistor includes a gate formed near the periphery of said horizontal device area and having a vertical depth approximately equal to the vertical device depth; an oxide layer on an inside surface of the gate; a conductive body formed inside the oxide layer, said conductive body having a top surface and a bottom surface and a vertical depth approximately equal to the vertical device depth; and diffusion regions in the conductive body near the top and bottom surfaces.

The above described memory cell further comprises a bitline coupled to the gate for providing a voltage representing a datum and a wordline coupled to the gate for providing the control signal.

A further aspect of the present invention relates to a vertical self-aligned thin film transistor who's body is fully depleted. That is, a transistor in which the conductive body lacks excess carriers to transport a current. The fully depleted state is caused by applying a bias voltage to the gate area that surrounds the transistor such that an electric field is created that is capable of depleting the conductive body. In this state, the device is turned off.

Specifically, the vertical self-aligned thin film transistor of the present invention comprises a gate formed near the periphery of a horizontal device area and having a depth approximately equal to a vertical device depth; an oxide layer on an inside surface of the gate; a conductive body formed inside the oxide layer, said conductive body having a top surface and a bottom surface and a vertical depth approximately equal to the vertical device depth; and diffusion regions in the body near the top and bottom surfaces, wherein said conductive body is fully depleted.

DETAILED DESCRIPTION OF THE INVENTION

Figure 1A:
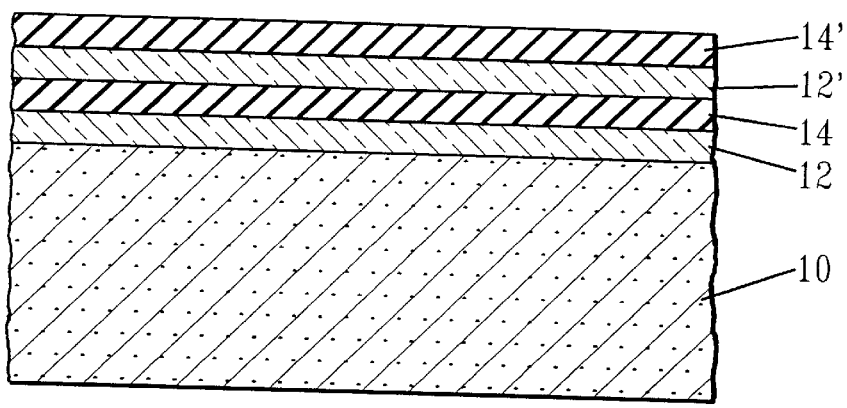
FIGS. 1a–1g are cross-sectional views depicting the various processing steps used in the present invention in providing a transistor that is self-aligned with the trench node of the capacitor.

The present invention, which provides a method for fabricating a memory cell wherein the transistor is self-aligned with the trench node of the capacitor as well as a novel memory cell design, will now be described in greater detail by referring to the drawings that accompany the present application. It is noted that in the drawings like reference numerals are used in describing like and/or corresponding elements of the drawings.

Reference is first made to the structure shown in FIG. 1a. Specifically, the structure shown in FIG. 1a comprises a substrate 10 having a dielectric stack formed thereon. The dielectric stack is composed of a first oxide layer 12, a first nitride layer 14, a second oxide layer 12' and a second nitride layer 14'. Layers 12' and 14' are employed in the present invention as a mask which is used in forming the wordlines of the cell, while dielectric stack layers 14 and 12 serve to reduce the wordline capacitance of the cell.

Substrate 10 may be composed of any conventional semiconductor material known in the art, including, but not limited to: Si, Ge, SiGe, GaAs, InAs, InP or other III/V compounds. The substrate may be doped or undoped and it may contain various device or isolation regions therein. For simplicity, such regions are not shown in the drawings of the present invention.

The dielectric stack is formed using conventional deposition processes including, but not limited to: chemical vapor deposition (CVD), plasma-assisted chemical vapor deposition, physical vapor deposition, sputtering, evaporation, plating and other like deposition processes. Combinations of one or more of these deposition techniques may also be used in the present invention in forming the dielectric stack. Conventional planarization processes such as chemical-mechanical polishing (CMP) or grinding may optionally be employed after deposition of each successive layer or it may be performed on one or more of the layers immediately after deposition of the specific dielectric layer.

Oxide layers 12 and 12' may be composed of the same or different conventional oxide material, e.g. $SiO_2$ or $Al_2O_3$ Likewise, nitride layers 14 and 14' may also be composed of the same or different conventional nitride material, e.g. $Si_3N_4$ or TiN. The overall thickness of the dielectric stack may vary, but typically the overall thickness of the dielectric stack is from about 250 to about 450 nm. Moreover, each of the deposited oxide layers has a thickness of from about 50 to about 200 nm, while each deposited nitride layer has a thickness of from about 20 to about 70 nm.

A trough which extends across the entire horizontal surface of the structure is then formed through second nitride layer 14' and second oxide layer 12' stopping on top of first nitride layer 14. The horizontal trough is formed in the present invention using conventional etching processes that are highly selective in removing those layers. For example, reactive-ion etching (RIE), plasma etching, ion beam etching or another suitable dry etching process may be employed in forming the horizontal trough. Alternatively, a wet etch process which utilizes a chemical etchant such as hot phosphoric acid may also be used to provide the horizontal trough in the structure.

Figure 1B:
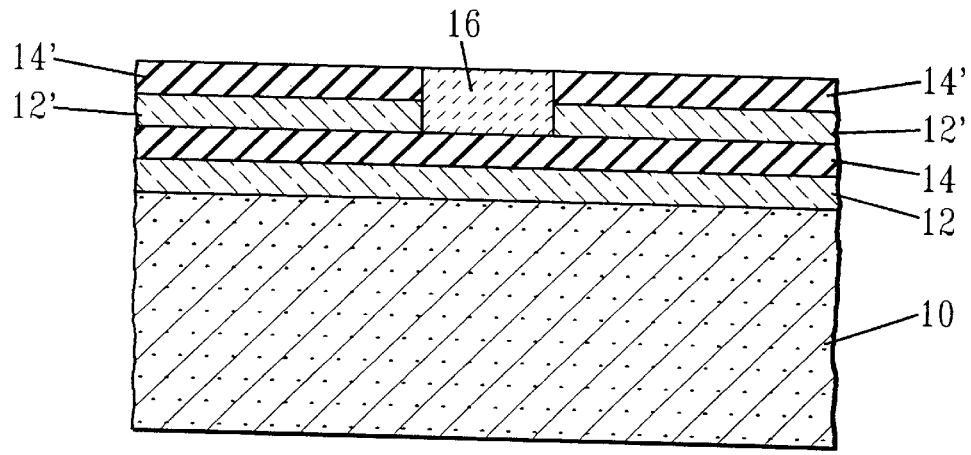

As shown in FIG. 1b, the horizontal trough is filled with a refractory metal such as Cu, Ti, Ta, Al or W. Alloys, compounds and multilayers thereof are also contemplated in the present invention. A highly preferred refractory metal employed in the present invention is W. It is noted that the filled trough represents wordline 16 of the memory cell of the present invention. The refractory metal is filled into the horizontal trough using conventional deposition processes well known to those skilled in the art. This includes any of the previously mentioned deposition processes. A conventional planarization step may be used to remove any refractory metal that may extend above the horizontal trough.

A vertical trench is then formed in selective areas of wordline 16 extending down through the first oxide/nitride layers of the dielectric stack into substrate 10 using second nitride layer 14' as a masking layer. It is noted that the vertical trench is orthogonal to wordline 16 and it is employed in the present invention for housing the capacitor of the memory cell of the present invention. The vertical or 'deep' trench is formed using any conventional method well known to those skilled in the art that is capable of forming a trench in the structure which extends from about 7,000 to about 10,000 nm below the surface of substrate 10. Lithography and RIE or any other like process may be used in forming the vertical trench. After formation of the deep trench in the structure, second nitride layer 14' as well as the resist used in defining the trench is removed using conventional stripping techniques that are well known to those skilled in the art. It is noted that if a top view of this structure was shown, it would have rows of alternating wordline regions and deep trench regions, each row being spaced apart by second nitride layer 14'.

Figure 1C:
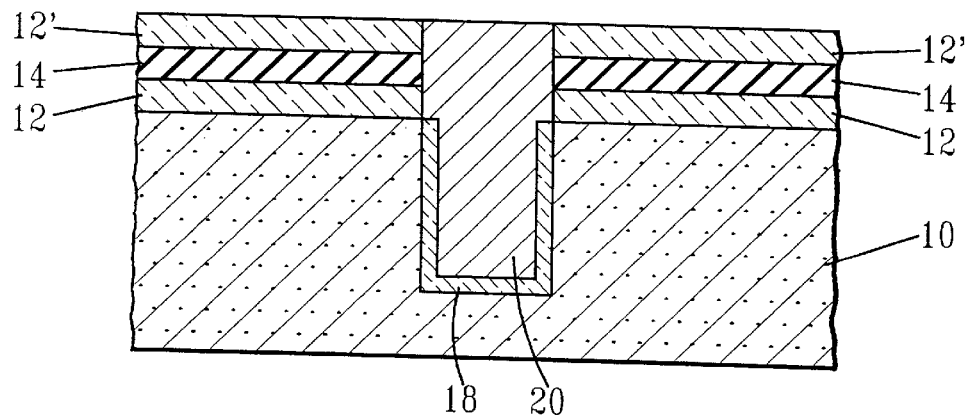

A node dielectric (or capacitor node) 18 (See, FIG. 1c) is then formed in the deep trench using conventional deposition and/or thermal growing processes. Conventional node dielectric materials such as $SiO_2$ are employed in the present invention. In accordance with the present invention, the node dielectric layer is formed below the first oxide layer of the dielectric stack lining the interior walls of the vertical trench. While not being critical to the present invention, the total thickness of node dielectric 18 is typically from about 2 to about 6 nm.

Next, the deep trench is filled with polysilicon or another conductive material that is doped with either a n-type dopant or a p-type dopant so as to form a lower conductive region in the structure. Lower conductive region 20 is formed using conventional deposition processes including any of those previously mentioned herein. The doping may be carried out in-situ or it may be carried out after deposition of conductive region 20. If necessary, the structure shown in FIG. 1c, may be planarized using any of the above mentioned planarization techniques.

Figure 1D:
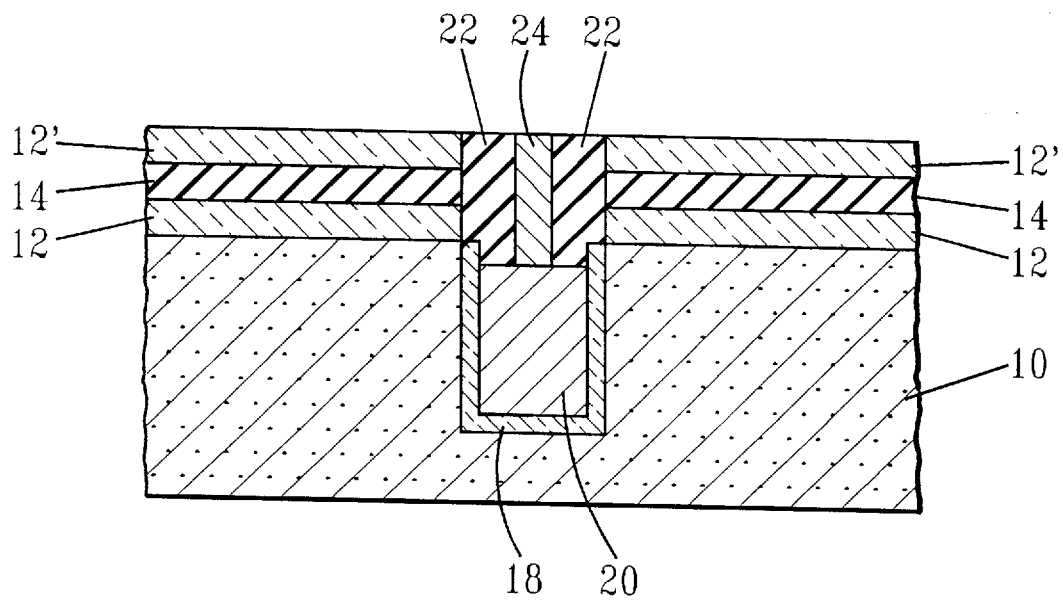

Reference is next made to FIG. 1d wherein the next steps of the present invention are illustrated. Specifically, after filling the deep trench with doped polysilicon or another conductive material, the doped polysilicon or other conductive material is recessed below the first oxide layer 12 using a selective etch process which is capable of providing a recess in the deep trench. For example, RIE or another like dry etching processes may be used in providing the recess in conductive region 20.

Nitride spacers 22 are then formed on exposed sidewalls of the recessed deep trench using a conventional deposition process that is capable of forming a conformal layer on each sidewall. For example, conventional CVD may be employed in forming the nitride spacers. The nitride spacers are employed in the present invention as mandrels for creating a self-aligned gate inside the deep trench.

A top conductive region 24 is then formed in the remaining portion of the recessed deep trench by filling it with polysilicon (or like conductive material) that is doped with a dopant opposite to that used in forming lower conductive region 20. Upper conductive region 24 which represents the conductive body of the transistor is formed using any of the above mentioned deposition processes and the structure may optionally be planarized using conventional planarization techniques.

Figure 1E:
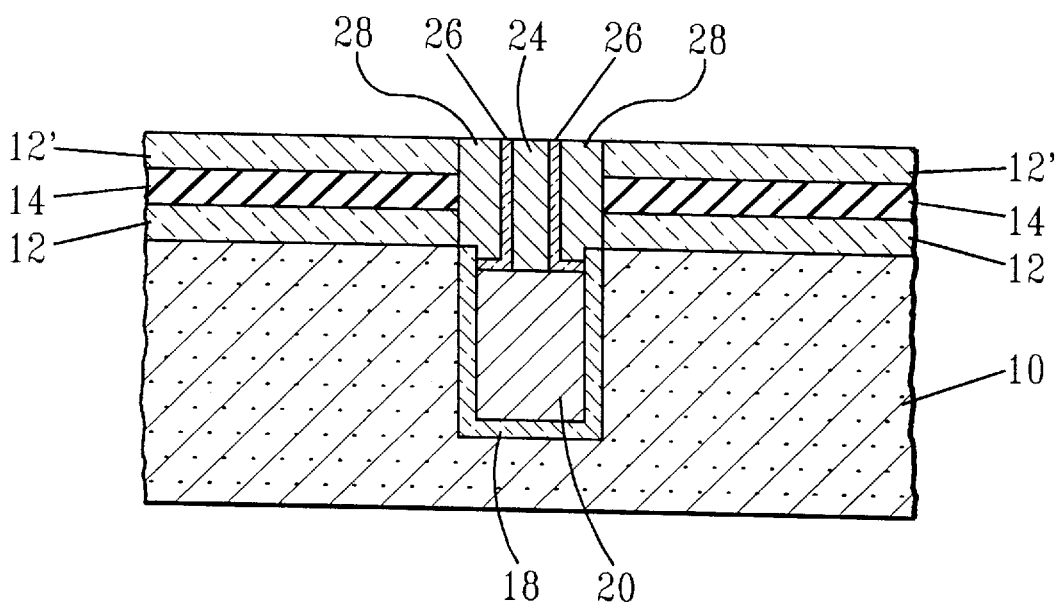

FIG. 1e provides an illustration of the structure that is formed using the following processes steps: After forming the upper conductive region in the deep trench, the nitride spacers are then removed using a conventional etch process that is highly selective in removing nitride as compared to the conductive material. A conventional gate dielectric material, e.g. $SiO_2$ or $Si_3N_4$, is then formed around upper conductive region 24 as well as on any portions of lower conductive region 20 that is exposed. Any conventional growing processes such as epitaxial growing can be employed in the present invention in forming gate dielectric region 26. The remaining portions of the recessed trench are then filled with a conventional gate conductor, e.g. doped polysilicon, so as to form the surround gate region 28 of the structure.

A unique feature of the structure shown in FIG. 1e is the self-aligned formation of the transistor, i.e. layers 28, 26 and 24, above the deep trench where lower conductive region 20 forms a plate of the capacitor and a source/drain diffusion terminal of the transistor, and the bitline, which is described hereinbelow, forms the other source/drain diffusion terminal of the transistor.

Figure 1F:
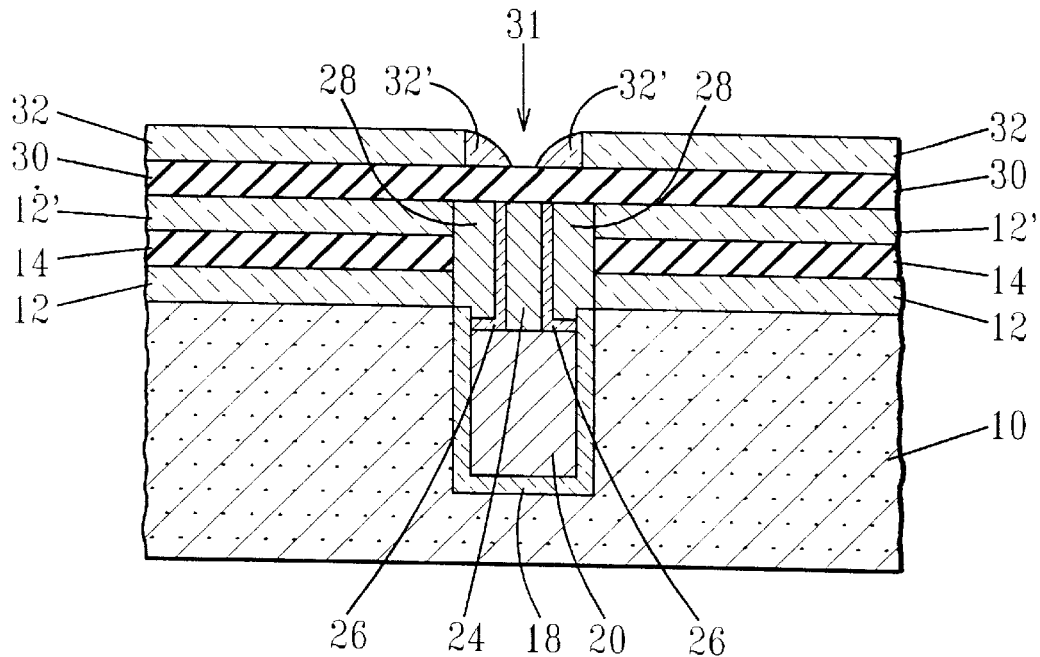
Figure 1G:
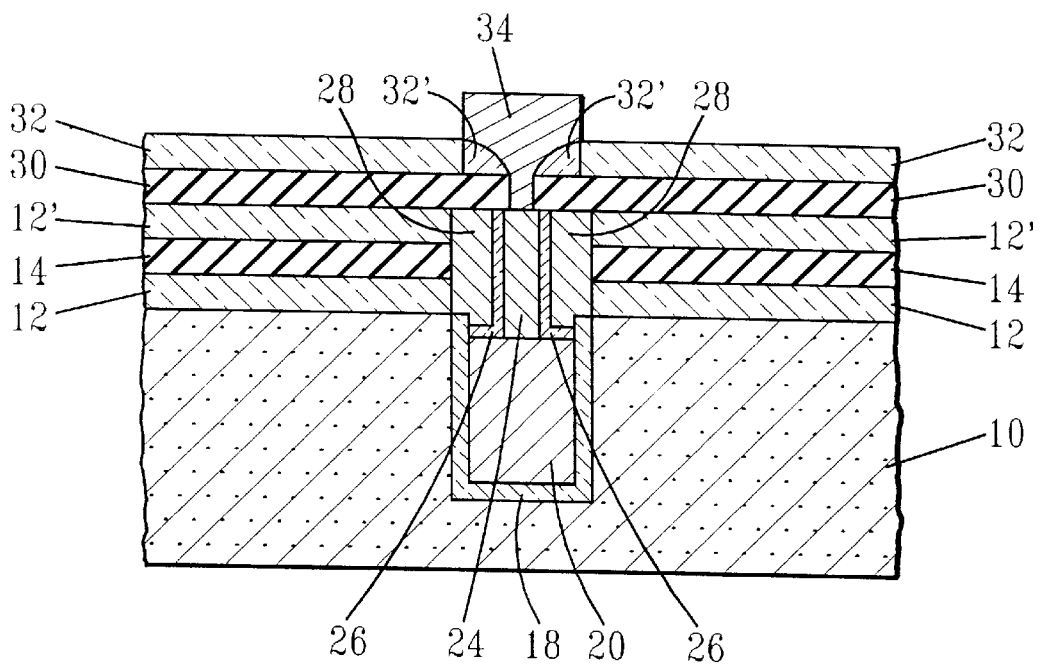

FIGS. 1f and 1g show the steps used in forming a bitline contact of the cell. Specifically, as shown in FIG. 1f, a layer of nitride 30 followed by a layer of oxide 32, is formed on the exposed upper surface of the structure. Any conventional deposition process, including those mentioned hereinabove, may be used in forming these layers. An opening 31 is provided in oxide layer 30 using conventional lithography and etching, e.g. RIE, stopping on nitride layer 30. Oxide spacers 32' are then formed in the opening overlapping the underlying gate dielectric region.

Next, as shown in FIG. 1g, nitride layer 30 is etched exposing upper conductive region 24 of the cell and bitline 34 is formed using conventional techniques known in the art including: depositing a conventional bitline conductor and patterning the same using lithography and RIE. Suitable conductors for bitline 34 include the same or different refractory metal as wordline 16.

While this invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated, but fall within the scope of the appended claims.

Having thus described our invention in detail, what we claim as new, and desire to secure by the Letters Patent is:

1. A method of forming a memory cell containing a vertical transistor that is self-aligned with an underlying node dielectric layer, said method comprising the steps of:
   (a) providing a substrate, said substrate having a dielectric stack formed on a surface thereof;
   (b) forming a vertical trench in said dielectric stack and said substrate;
   (c) forming a capacitor node and a lower conductive region in said vertical trench, said capacitor node and said lower conductive region occupying a horizontal capacitor area; and
   (d) forming a transistor above said capacitor node and said lower conductive region, said transistor occupying a horizontal device area substantially equal to that of the horizontal capacitor area, wherein said transistor is formed by the steps of forming a surround gate near the periphery of the horizontal device area; forming an oxide layer on an inside surface of the surround gate; forming a conductive body inside the oxide layer, said conductive body having a top surface and a bottom surface; and forming diffusion regions in the conductive body near the top and bottom surfaces.

2. The method of claim 1 wherein said substrate comprises a semiconducting material selected from the group consisting of Si, Ge, SiGe, GaAs, InAs, InP and other III/V compounds.

3. The method of claim 1 wherein said dielectric stack comprises alternating oxide and nitride layers.

4. The method of claim 3 wherein said oxide layers are composed of $SiO_2$ or $Al_2O_3$ and said nitride layers are composed of $Si_3N_4$ or TiN.

5. The method of claim 1 wherein said vertical trench is formed by lithography and reactive-ion etching (RIE).

6. The method of claim 1 wherein said capacitor node is formed by deposition or a thermal growing process.

7. The method of claim 1 wherein said lower conductive region and said conductive body of said transistor are composed of oppositely doped conductive materials.

8. The method of claim 7 wherein said conductive material is polysilicon.

9. The method of claim 1 further comprising steps of forming a bitline coupled to the conductive body of the cell and forming a wordline that is coupled to the gate.

10. The method of claim 9 wherein said wordline and said bitline are composed of the same or different refractory metal selected from the group consisting of Cu, Ti, Ta, Al, W and alloys, compounds or multilayers thereof.

* * * * *

UNITED STATES PATENT AND TRADEMARK OFFICE
CERTIFICATE OF CORRECTION

PATENT NO. : 6,228,706 B1
DATED : May 8, 2001
INVENTOR(S) : David V. Horack et al.

Page 1 of 1

It is certified that error appears in the above-identified patent and that said Letters Patent is hereby corrected as shown below:

<u>Title page,</u>
Item [56], References Cited, U.S. PATENT DOCUMENTS,
"Womack" should read -- Womack et al. --, "Kamata" should read -- Kamata et al. --

<u>Column 3,</u>
Line 37, "Al$_2$O$_3$" should read -- Al$_2$O$_3$. --

Signed and Sealed this

Thirtieth Day of April, 2002

Attest:

Attesting Officer

JAMES E. ROGAN
*Director of the United States Patent and Trademark Office*